United States Patent
Djordjevic et al.

(10) Patent No.: US 7,737,818 B2
(45) Date of Patent: Jun. 15, 2010

(54) EMBEDDED RESISTOR AND CAPACITOR CIRCUIT AND METHOD OF FABRICATING SAME

(75) Inventors: Aleksandra Djordjevic, Plano, TX (US); Carl W. Berlin, West Lafayette, IN (US)

(73) Assignee: Delphi Technologies, Inc., Troy, MI (US)

( * ) Notice: Subject to any disclaimer, the term of this patent is extended or adjusted under 35 U.S.C. 154(b) by 485 days.

(21) Appl. No.: 11/891,067

(22) Filed: Aug. 8, 2007

(65) Prior Publication Data

US 2009/0040010 A1 Feb. 12, 2009

Related U.S. Application Data

(60) Provisional application No. 60/963,759, filed on Aug. 7, 2007.

(51) Int. Cl.
*H01C 1/012* (2006.01)
(52) U.S. Cl. .................. 338/308; 338/309; 361/793; 175/255
(58) Field of Classification Search ......... 338/307–309; 361/793, 765, 766, 795; 174/255, 256, 261; 29/830, 832; 216/16, 20
See application file for complete search history.

(56) References Cited

U.S. PATENT DOCUMENTS

| | | | |
|---|---|---|---|
| 4,452,726 A | | 6/1984 | Palanisamy et al. |
| 4,808,967 A | * | 2/1989 | Rice et al. .................... 338/309 |
| 4,870,746 A | * | 10/1989 | Klaser .......................... 29/620 |
| 5,144,279 A | * | 9/1992 | Yajima et al. ................ 338/270 |
| 5,221,644 A | | 6/1993 | Berlin et al. |
| 5,466,892 A | * | 11/1995 | Howard et al. .............. 174/261 |
| 6,207,522 B1 | * | 3/2001 | Hunt et al. ................... 438/393 |
| 6,356,455 B1 | * | 3/2002 | Carpenter .................... 361/793 |
| 6,500,350 B1 | * | 12/2002 | Hunt et al. ...................... 216/16 |
| 7,013,561 B2 | * | 3/2006 | Nakatani et al. .............. 29/852 |
| 7,042,331 B2 | | 5/2006 | Zhou et al. |
| 2004/0216303 A1 | | 11/2004 | Berlin et al. |

* cited by examiner

*Primary Examiner*—Kyung Lee
(74) *Attorney, Agent, or Firm*—Jimmy L. Funke

(57) ABSTRACT

An embedded resistor and capacitor circuit and fabrication method is provided. The circuit includes a substrate, a conductive foil laminated to the substrate, and a thick film dielectric material disposed on the conductive foil. One or more thick film electrodes are formed on the dielectric material and a thick film resistor is formed at least partially contacting the thick film electrodes. A capacitor is formed by an electrode and the conductive foil. The electrodes serve as terminations for the resistor and capacitor.

8 Claims, 4 Drawing Sheets

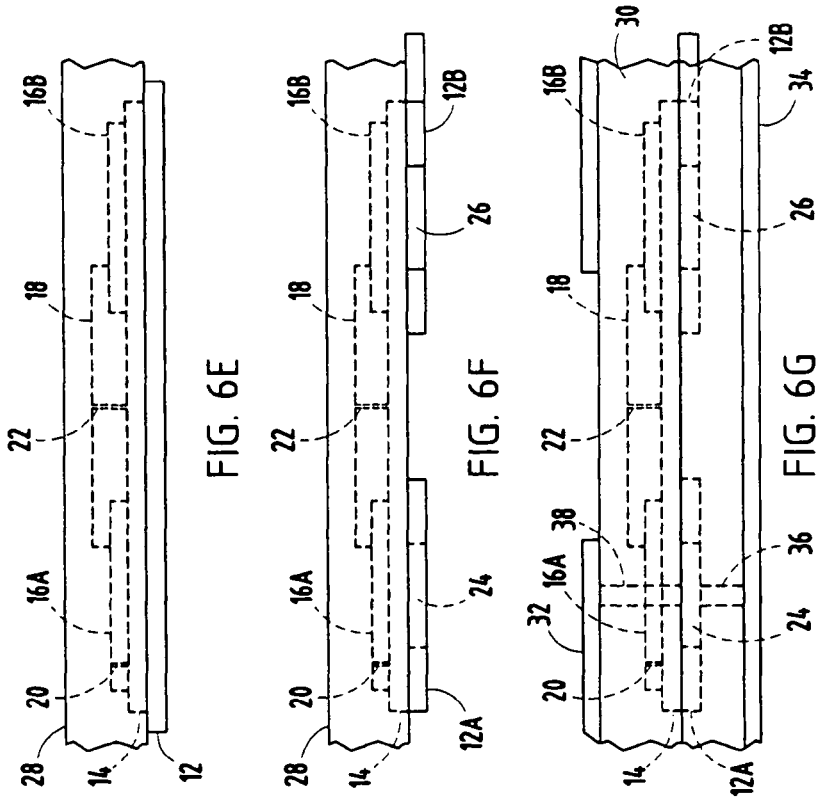
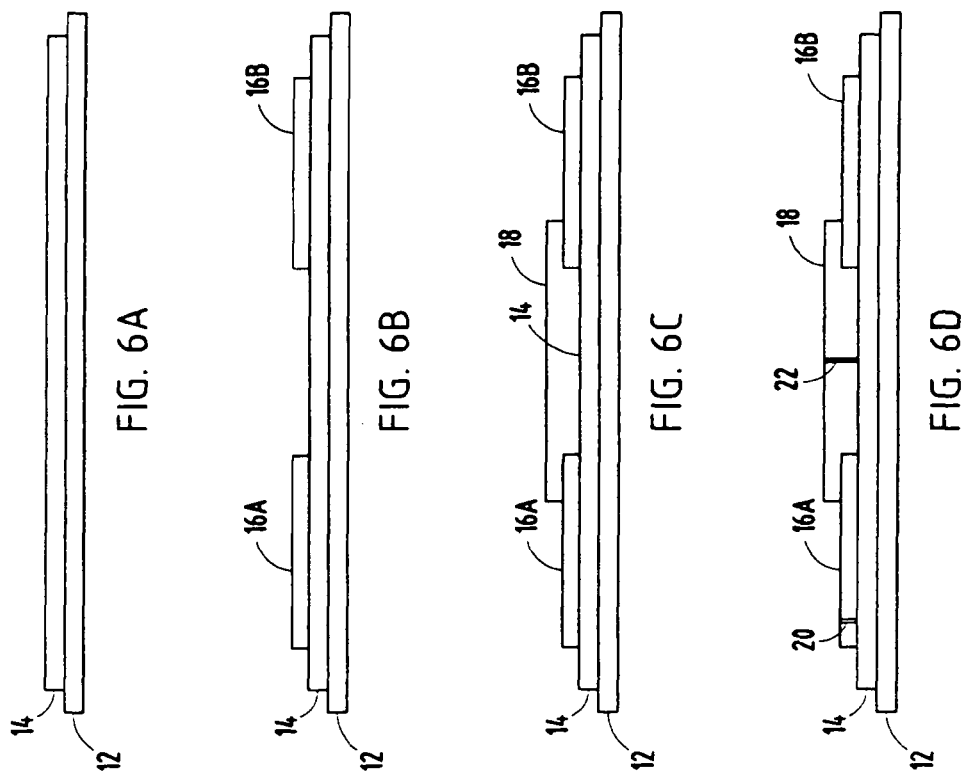

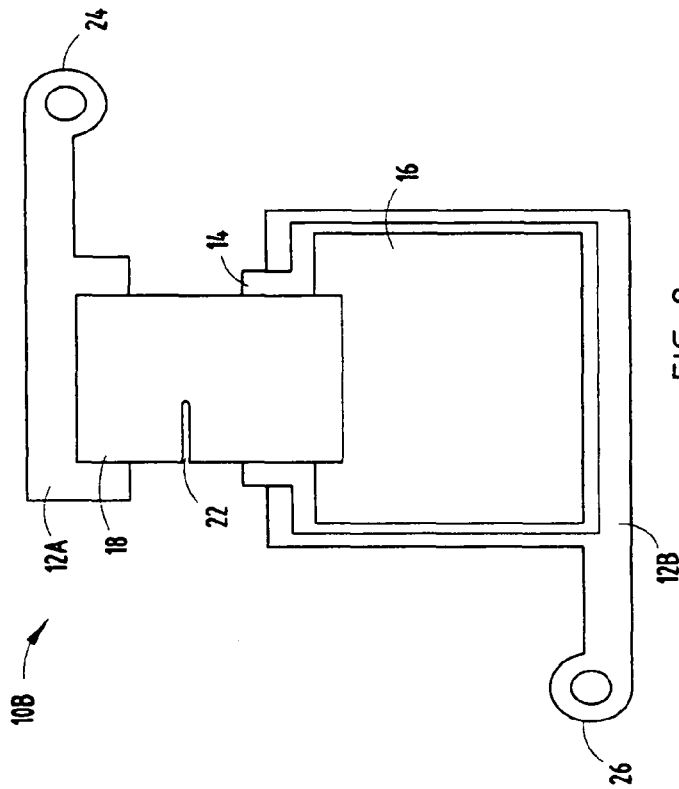
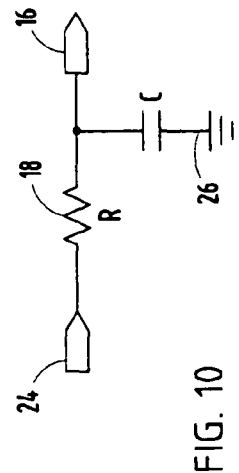
FIG. 9
FIG. 10
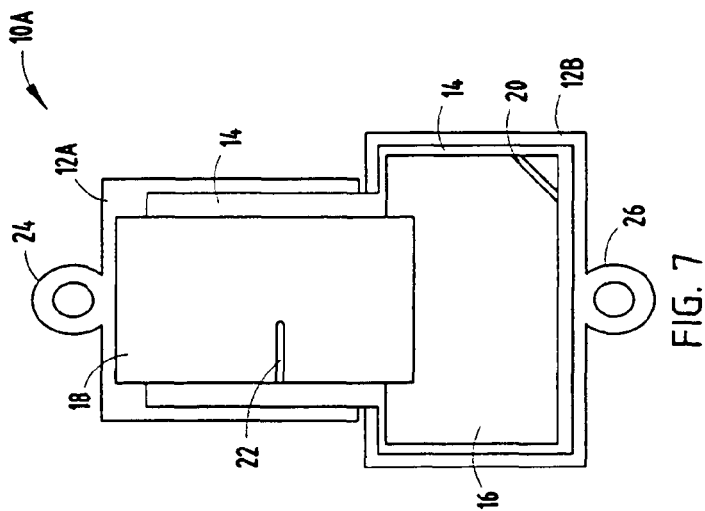
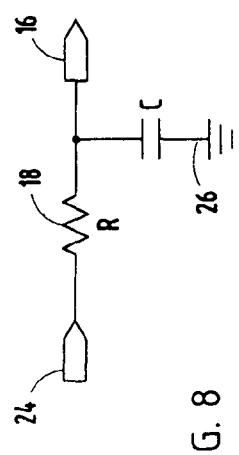
FIG. 7
FIG. 8

EMBEDDED RESISTOR AND CAPACITOR CIRCUIT AND METHOD OF FABRICATING SAME

CROSS-REFERENCE TO RELATED APPLICATIONS

The subject patent application claims priority to and all the benefits of U.S. Provisional patent application Ser. No. 60/963,759, which was filed on Aug. 7, 2007.

STATEMENT REGARDING JOINT RESEARCH AGREEMENT

The claimed invention was made as a result of activities undertaken within the scope of a joint research agreement between E.I. du Pont de Nemours and Company; Delphi Automotive Systems LLC; and Viasystems Technologies Corp., LLC that was in effect on or before the date the claimed invention was made.

TECHNICAL FIELD

The present invention generally relates to thick film passive circuit components, and more particularly to thick film resistor and capacitor circuitry and a method of fabricating thick film resistor and capacitor circuitry.

BACKGROUND OF THE INVENTION

Embedded passive electrical circuit components are commonly designed as individual components that are individually fabricated and embedded into a substrate. For example, resistors and capacitors are typically designed as individual electrical circuit components that may be formed using thick film materials, usually applied in the form of a thick film ink applied via a printing technique.

Conventional thick film resistors can be formed by printing an ink film of copper compatible resistor material, such as resistor formulations utilizing $LaB_6$ as a functional phase, on a copper foil substrate. The printed thick film ink is then fired at an elevated temperature to cure. An encapsulation material may be printed on top of the resistor. The copper foil may be etched and laser trimming may be employed to achieve desired electrical resistance characteristics. The resistor circuit is then embedded into a substrate, such as a laminated substrate.

Conventional thick film capacitors can similarly be formed by printing and firing a thick film dielectric material on top of a copper foil and forming a capacitor electrode on top of the dielectric material. The resulting capacitor may be encapsulated and laminated onto a core of a substrate. Additionally, the capacitor electrode may be laser trimmed to achieve desired electrical capacitive characteristics. The capacitor circuit is then embedded into a substrate, such as a laminated substrate.

The conventional methodology for fabricating individual resistors and capacitors is generally limited to achieving certain circuit component densities which limits the number of passive components in a given amount of space that is available. Additionally, the embedded resistor and capacitor components typically can only be tested and trimmed after being laminated into the inner layer of the substrate which risks performing valuable steps on a potentially defective foil.

What is desired is a passive circuit that provides multiple circuit components and does not suffer the space limitations of conventional thick film passive circuit designs. In particular, it is desirable to provide for a resistor and capacitor circuit that may be easily employed in a laminated circuit board. Additionally, it is desirable to provide for a fabrication method that achieves enhanced embedded passive circuit densities. It is also desired to test and adjust the resistors and capacitors prior to lamination into the core of a substrate.

SUMMARY OF THE INVENTION

According to one aspect of the present invention, an embedded resistor and capacitor circuit is provided that includes a substrate, a conductive foil laminated to the substrate, and a thick film dielectric material disposed on the conductive foil. A thick film electrode is formed on the dielectric material and a thick film resistor is formed at least partially contacting the thick film electrode. A capacitor is formed by the electrode and the conductive foil disposed on the dielectric material. The electrode serves as a termination for the resistor and capacitor and as a capacitor electrode.

According to another aspect of the present invention, a method of fabricating resistor and capacitor circuitry is provided. The method includes the steps of providing a conductive foil, depositing a thick film dielectric material on the conductive foil, and depositing a thick film electrode on the dielectric material. The method also includes the steps of depositing a thick film resistor at least partially on the thick film electrode, laminating the conductive foil onto a core of a substrate, etching the conductive foil to form a desired circuit configuration, and laminating the core in a substrate.

The resistor and capacitor circuit and method advantageously provide for an integral resistor and capacitor arrangement that may be embedded in a substrate to achieve a high circuit component density, thus efficiently utilizing available space. Additionally, the method and resulting circuit allows for utilization of a common terminal or electrode for the resistor and capacitor and allows for enhanced testing and trimming of the resulting circuit, particularly early into the process of fabrication (before lamination) and simultaneous resistor and capacitor value adjustments.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which:

FIGS. 6A-6G are side views of the circuit at various stages of the fabrication process;

FIG. 7 is a top view of a resistor and capacitor circuit according to a second embodiment of the present invention;

FIG. 8 is a circuit diagram illustrating the equivalent electrical circuit of FIG. 7;

FIG. 9 is a top view of a resistor and capacitor circuit, according to a third embodiment of the present invention; and FIG. 10 is a circuit diagram illustrating the equivalent electrical circuit of FIG. 9.

DESCRIPTION OF THE PREFERRED EMBODIMENTS

Figure 2:
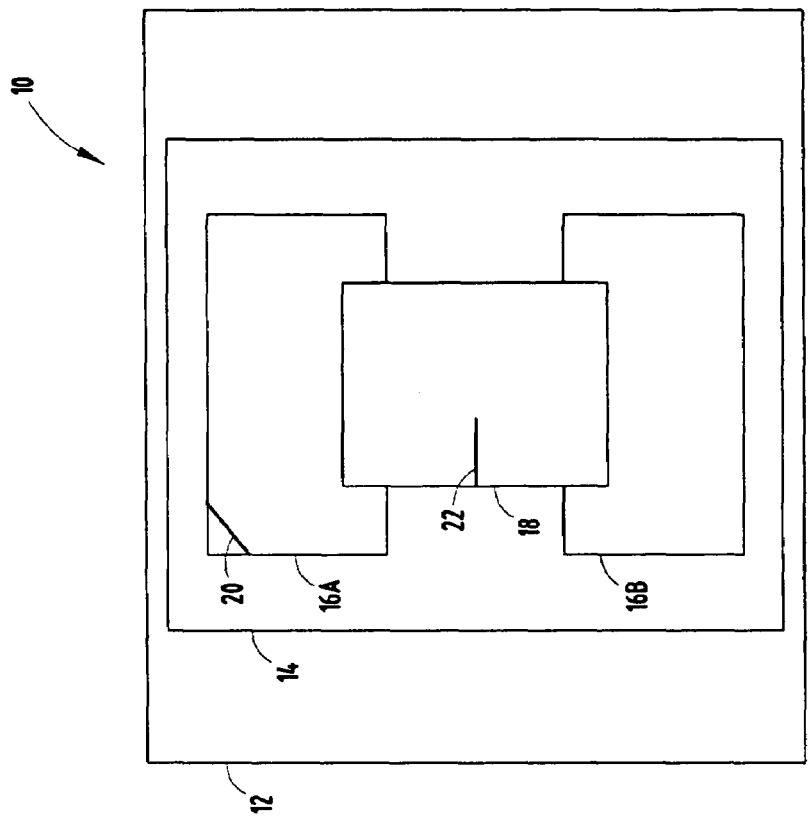
FIG. 2 is a top view of the circuit of FIG. 1 further illustrating the testing and trimming of the circuit.
Figure 1:
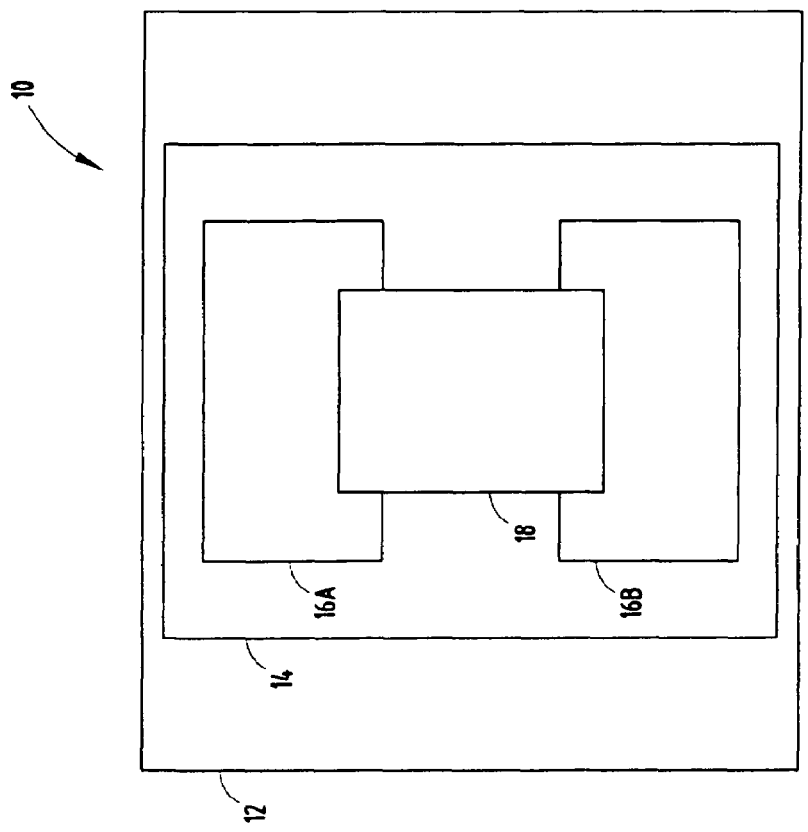
FIG. 1 is a top view of a resistor and capacitor circuit illustrating the printing and firing of thick film materials, according to one embodiment.
Figure 3:
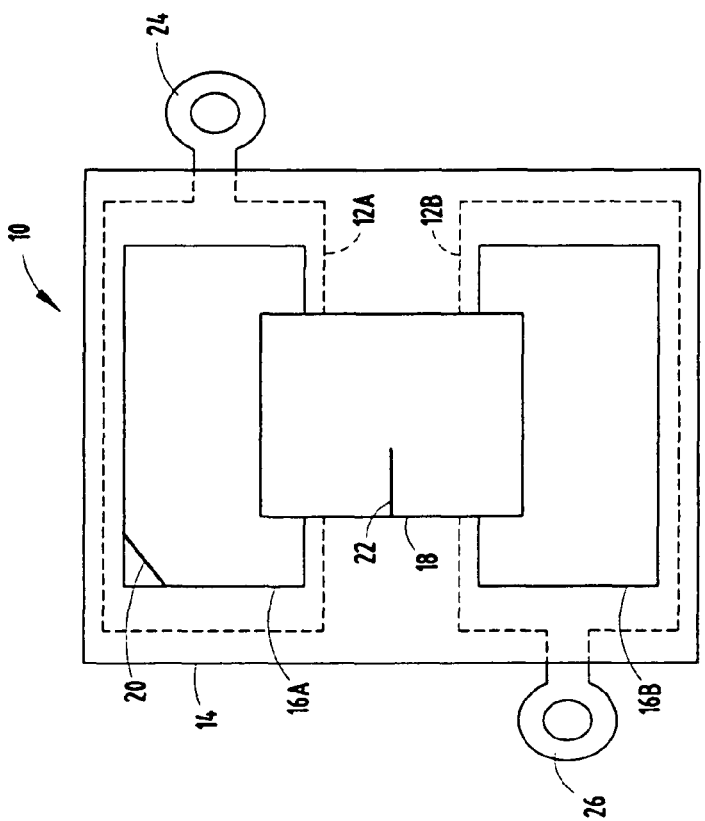
FIG. 3 is a top view of the circuit of FIG. 1 further illustrating lamination and etching of the circuit.
Figure 4:
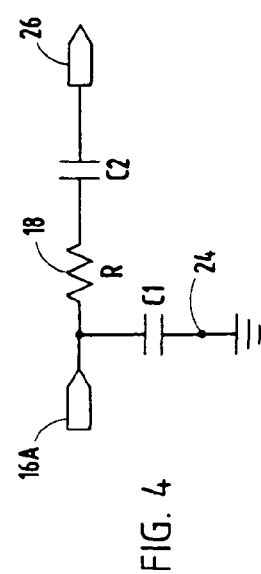
FIG. 4 is a circuit diagram illustrating the equivalent electrical circuit of FIG. 3.

Referring to FIGS. 1-3, an embedded resistor and capacitor circuit 10 is generally illustrated following certain steps of a fabrication method according to a first embodiment. The equivalent electrical circuit diagram of completed circuit 10 is illustrated in FIG. 4. The circuit 10 includes at least both a resistor and a capacitor as passive circuit components that are integrally fabricated and embedded into a laminated substrate. In the first exemplary embodiment, the circuit 10 includes two capacitors and a single resistor. However, it should be appreciated that the resistor and capacitor circuit 10 may include one or more resistors and one or more capacitors embedded into a substrate.

Referring to FIG. 1, the circuit 10 is shown employing a conductive foil, such as a copper foil 12. The copper foil 12 may be formed as a thin rectangular sheet, however, the foil may be formed in various other shapes and sizes. A thick film dielectric material 14 is deposited on top of at least a portion of the copper foil 12. The thick film dielectric material 14 may include any known dielectric thick film material, such as barium titanate or any traditional multilayer thick film or any high dielectric constant thick film capacitor dielectric which may be applied as a printed ink. According to one embodiment, the dielectric material 14 may include a thick film dielectric paste based on a barium titanate functional base. The thick film dielectric material 14 should be of a sufficient size and shape to provide a dielectric medium between the underlying copper foil 12 and overlying electrical circuit components. The thick film dielectric material 14 may have a wide range of dielectric constant.

The circuit 10 also includes at least one thick film electrode deposited on top of the thick film dielectric 14. In the present embodiment, first and second thick film electrodes 16A and 16B are deposited on top of the thick film dielectric 14. The first and second thick film electrodes 16A and 16B may include any electrically conductive electrode material, such as copper.

The thick film electrodes 16A and 16B form capacitor electrodes, and also serve as common terminals or electrodes with one or more resistors. The thick film electrodes 16A and 16B form capacitors with the copper foil 12 via the dielectric material 14. The surface area of the thick film electrodes 16A and 16B, along with the surface areas of the copper foil 12 portions that serve as opposing electrodes, and the dielectric characteristics of the dielectric material 14 such as thickness, material type, etc., determine the capacitance value of the resulting capacitors.

A thick film resistor 18 is fabricated at least partially on top of the first and second electrodes 16A and 16B, such that the resistor 18 electrically contacts both electrodes 16A and 16B. The resistor 18 is also shown overlying the dielectric material 14 in the region generally between electrodes 16A and 16B. The resistor 18 includes a thick film resistor material, such as an ink film of electrically resistive material that is printed and subsequently fired or otherwise cured. The resistor material 18 extends from the first electrode 16A to the second electrode 16B to provide a desired electrical resistance.

The thick film resistor material 18 may be based on a nitrogen atmosphere firing thick film system that uses lanthanum boride $LaB_6$ as the conductive phase of the resistor body according to one embodiment. According to another embodiment, the thick film resistor material 18 may include a composition containing palladium and silver of a known ratio to obtain a desired sheet resistance, such as is disclosed in U.S. Pat. No. 5,221,644. In a further embodiment, the thick film resistor material may be a polymer thick film material. Examples of this polymer thick film embodiment include carbon-silver or Ru-based polymer thick films. The entire disclosure of the aforementioned U.S. patent is hereby incorporated herein by reference. Techniques for printing and firing thick film electrical components, such as resistor components, are known in the art. Examples of thick film electrical component fabrication techniques are described in U.S. Pat. Nos. 7,042,331 and 4,452,726, the entire disclosures of which are hereby incorporated herein by reference. The printed and fired thick film materials may have a thickness sufficient to provide the desired electrical characteristics. In one embodiment, the thickness is in the range of about 10 to 50 microns. According to a further embodiment, the resistor material 18 may have a thickness in the range of about 40 to 50 microns.

Referring specifically to FIG. 2, the resistor and capacitor circuit 10 is further shown trimmed with a laser trimming technique to provide desired electrical characteristics (resistance and capacitance). In particular, a first laser trimmed opening or gap 20 is shown formed in the first electrode 16A. It should be appreciated that any known trimming technique may be employed to change the area of the capacitive plates so as to change the resulting capacitance achieved in the circuit 10. Additionally, a second laser trimmed opening or gap 22 is shown formed extending into the resistor 18. Any known trimming technique may be employed to trim the resistor 18 so as to achieve the desired value of resistance.

Referring to FIG. 3, the copper foil 12 is shown essentially etched away into a pattern to form first and second copper electrode sheets 12A and 12B. First and second copper sheets 12A and 12B form electrodes that are generally aligned with electrodes 16A and 16B, respectively, which provide the first and second capacitors. The copper foil 12 on the back side is etched all the way to the dielectric material 14 in a pattern such that the resulting conductive electrode sheets 12A and 12B are fabricated below corresponding electrodes 16A and 16B. The first copper pad 12A is parallel to and dielectrically isolated from the first electrode 16A so as to form a first capacitor C1. The second copper pad 12B is parallel to and dielectrically isolated from the second electrode 16B so as to form a second capacitor C2. Additionally, the first and second copper electrode sheets 12A and 12B include first and second contact pads 24 and 26, respectively. Contact pads 24 and 26 are formed as extensions of the sheets 12A and 12B and allow for electrical contact to be made with the corresponding first and second copper electrode sheets 12A and 12B. The contact pads 24 and 26 may be formed in any of a number of shapes and sizes to accommodate electrical interconnection.

The resulting equivalent electrical circuit for the circuit 10 is shown in FIG. 4 having a single resistor R and the two capacitors C1 and C2. It should be appreciated that the resistor R is formed by the resistor material 18 extending between the first and second electrodes 16A and 16B. The first capacitor C1 is achieved by a capacitance between the first copper electrode sheet 12A and the first electrode 16A, while the second capacitor C2 is achieved by a capacitance between the second copper electrode sheet 12B and the second electrode 16B. The resulting circuit 10 provides electrodes 16A and 16B that serve as terminals or electrodes for both the capacitor connections and the resistor connections. As seen in the circuit 10, the first electrode 16A is configured to receive an input signal, the contact pad 24 is grounded, and the contact pad 26 is configured to provide an output signal as a function of the resistance and capacitance.

Figure 5:
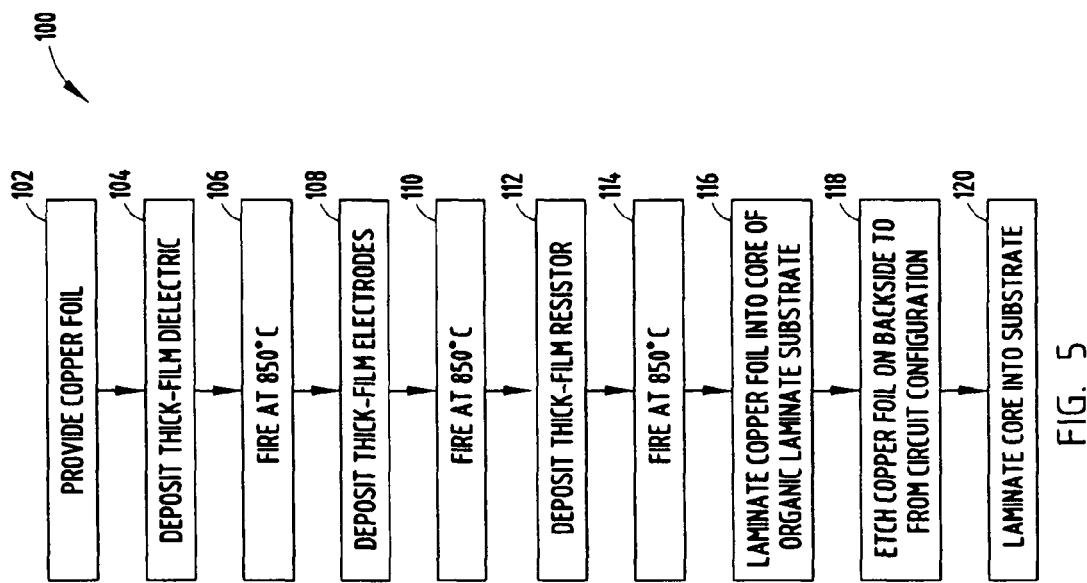
FIG. 5 is a flow diagram illustrating a methodology of fabricating an embedded resistor and capacitor circuit, according to one embodiment.

A methodology 100 of fabricating the resistor and capacitor circuit 10 is illustrated in FIG. 5, according to one embodiment. Method 100 includes the steps of providing the copper foil in step 102, and depositing a thick film dielectric material on the copper foil in step 104. The thick film dielectric material can be printed as an ink using known thick film printing techniques. Next, the thick film dielectric material on the foil is typically fired at a temperature in the range of about 850° to 950° C. so as to form the thick film dielectric material. In one embodiment, the firing ranges vary from 120° to 950° C., dependent upon the materials used. In a further embodiment, the dielectric material is fired in the range of 120° to 300° C. Method 100 further includes step 108 of depositing thick film electrodes onto the dielectric material to form the first and second electrodes, and step 110 of firing the circuit at a temperature in the range of about 850° to 950° C. so as to cure the thick film electrodes. The thick film electrodes may be applied by printing thick film ink according to known techniques. Further, method 100 includes step 112 of depositing a thick film resistor on top of a portion of the electrodes and the dielectric material, and step 114 of firing the circuit at a temperature in the range of about 850° to 950° C. to cure the thick film resistor. The thick film resistor may be applied by printing an ink film of electrically resistive material as is known in the art. Method 100 further includes step 116 of laminating the copper foil into a core of organic laminate substrate, and step 118 of etching the copper foil on the back side to form the desired circuit configuration. In the present embodiment, the circuit configuration of the copper foil 12 following etching results in the electrode sheets 12A and 12B and corresponding contact pads 24 and 26. The core is then laminated into the substrate in step 120 to complete the fabrication of the resistor and capacitor circuit 10.

Fabrication of the resistor and capacitor circuit 10 is further illustrated in FIGS. 6A-6G. In FIG. 6A, the printed and fired thick film dielectric material 14 is shown deposited on top of the copper foil 12. In FIG. 6B, the thick film capacitor electrodes 16A and 16B are shown deposited on top of the dielectric material 14. In FIG. 6C, the thick film resistor 18 is printed and fired on top of the first and second electrodes 16A and 16B. Following fabrication of the resistor, the resistor and capacitor circuit 10 can be tested by applying test probes to electrically conductive regions such as the conductive foil 12 and electrodes 16A and 16B. In FIG. 6D, the circuit 10 is trimmed by laser etching a first gap 22 in resistor 18 and laser etching a second gap 20 in electrode 16A so as to trim the circuit 10 to achieve desired electrical characteristics. Electrode 16B may also be trimmed to achieve the desired electrical characteristics. In FIG. 6E, the circuit is laminated into a core 28. The core 28 encapsulates the circuit 10 on the top and lateral sides. The copper foil 12 remains exposed on the bottom side. In FIG. 6F, the copper foil 12 is etched into a pattern to form conductive electrode sheets 12A and 12B and contact pads 24 and 26. Finally, in FIG. 6G, the circuit 10 is embedded within a laminated substrate 30 such that the circuit 10 is encapsulated on all sides. Once encapsulated within the substrate 30, the circuit 10 is electrically connected to other electrical circuitry via electrical connections. The electrical connections may include conductive vias 36 and 38 providing electrical contact from conductive lines 32 and 34. According to one example, line 32 provides a signal and line 34 provides an electrical ground. The electrically conductive vias 36 and 38 are shown providing contact to the input and ground layers. Contact pad 26 is represented to extend to the output signal layer.

Referring to FIGS. 7 and 8, a resistor and capacitor circuit 10A is shown according to a second exemplary embodiment of the present invention. The circuit 10A is configured to provide a single resistor R and single capacitor C. In this embodiment, a single electrode 16 is employed instead of two electrodes as described above. The electrode 16 is dielectrically isolated from copper electrode sheet 12B via dielectric medium 14 to provide the single capacitor C. The electrode 16 is in electrical contact with resistor 18 at one end, and the other end of resistor 18 is in contact with the copper electrode sheet 12A. A first laser trimmed gap 22 is formed in resistor 18, and a second laser trimmed gap 20 is formed in electrode 16. According to this embodiment, the contact pad 24 provides the input signal as seen in FIG. 8, electrode 16 provides the output signal, and contact 26 is grounded.

Referring to FIGS. 9 and 10, a resistor and capacitor circuit 10B is illustrated according to a third exemplary embodiment. The circuit 10B also provides a single resistor R and single capacitor C arrangement. Circuit 10B is formed similar to circuit 10A in the second embodiment, except in the third embodiment, the resistor 18 is formed in a region without dielectric medium 14 extending completely underneath. The resulting resistor 18 is electrically coupled to the copper sheet 12A and electrode 16. A laser trimmed gap 22 is formed in the resistor 18 in a region where there is no underlying dielectric material, but this preferably occurs only after the lamination process is complete. In some embodiments, the capacitor is trimmed.

While the resistor and capacitor circuit of the present invention is described herein according to various embodiments shown as circuits 10, 10A and 10B as described above, it should be appreciated that the resistor and capacitor circuit could alternately be configured in various shapes and sizes. Additionally, the circuit may employ any number of resistors and capacitors integrally formed together and laminated into a substrate according to other embodiments. The arrangement of the resistor(s) and capacitor(s) may be configured in other circuit configurations to provide any of a number of series and/or parallel connections of resistor and capacitor components, without departing from the spirit of the present invention.

Accordingly, the resistor and capacitor circuits 10, 10A and 10B according to the various embodiments of the present invention advantageously provide for embedded networks that utilize common terminals for the resistor and capacitor electrodes, allow for advantageous adjustment of the resistor and capacitor values prior to lamination, and simultaneous adjustment of the resistors and capacitors prior to lamination. The resistor and capacitor circuits 10 and 10A also provide electrical isolation of resistor(s) prior to lamination and etching. Additionally, the resistor and capacitor circuits 10, 10A and 10B provide for enhanced circuit densities and efficient utilization of the space available in the substrate.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. An embedded resistor and capacitor circuit comprising:
a substrate;
a conductive foil laminated to the substrate;
a thick film dielectric material disposed on the conductive foil;
at least one thick film electrode formed on the dielectric material; and a resistor formed at least partially on the at least one thick film electrode, wherein the conductive foil and the at least one thick film electrode provides a capacitor and the at least one electrode serves as a common electrical connection for the resistor and capacitor and serves as a capacitor electrode.

2. The circuit as defined in claim 1, wherein the resistor comprises a thick film resistor material.

3. The circuit as defined in claim 1, wherein the conductive foil is laminated into the substrate.

4. The circuit as defined in claim 1, wherein the resistor comprises a laser trimmed gap.

5. The circuit as defined in claim 1, wherein the at least one of electrode comprises a laser trimmed gap.

6. The circuit as defined in claim 1 further comprising first and second contact pads for contacting electrical circuitry within the substrate.

7. The circuit as defined in claim 1, wherein the conductive foil comprises a copper foil.

8. The circuit as defined in claim 1, wherein the at least one electrode comprises first and second electrodes and the conductive foil provides first and second opposing electrode sheets.

* * * * *